(12) United States Patent
Jung

(10) Patent No.: US 8,674,734 B2
(45) Date of Patent: Mar. 18, 2014

(54) SYNCHRONOUS SEMICONDUCTOR DEVICE HAVING DELAY LOCKED LOOP FOR LATENCY CONTROL

(71) Applicant: SK hynix Inc., Gyeonggi-do (KR)

(72) Inventor: Jong-Ho Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 13/716,729

(22) Filed: Dec. 17, 2012

(65) Prior Publication Data

US 2014/0015575 A1   Jan. 16, 2014

(30) Foreign Application Priority Data

Jul. 16, 2012  (KR) .................. 10-2012-0077187

(51) Int. Cl.
    *H03L 7/06*     (2006.01)
(52) U.S. Cl.
    USPC .......................................... 327/158; 327/149
(58) Field of Classification Search
    USPC .................................... 327/149, 158
    See application file for complete search history.

(56) References Cited

U.S. PATENT DOCUMENTS

| | | | | |
|---|---|---|---|---|
| 7,675,797 B2* | 3/2010 | Jeong et al. | .................. | 365/193 |
| 7,936,636 B2* | 5/2011 | Jeong | ........................ | 365/233.1 |
| 8,045,406 B2* | 10/2011 | Kwon et al. | .................. | 365/191 |
| 8,294,499 B2* | 10/2012 | Kwon et al. | .................. | 327/164 |
| 8,503,256 B2* | 8/2013 | Ko | ................ | 365/194 |
| 8,564,341 B2* | 10/2013 | Kim | ................ | 327/156 |
| 2003/0174550 A1* | 9/2003 | Acharya et al. | ................ | 365/200 |
| 2008/0101140 A1* | 5/2008 | Jeong et al. | ................. | 365/193 |
| 2010/0128543 A1* | 5/2010 | Kwon et al. | .................. | 365/193 |
| 2010/0213992 A1* | 8/2010 | Hyun et al. | .................. | 327/147 |
| 2010/0244915 A1* | 9/2010 | Kwon et al. | .................. | 327/158 |
| 2010/0322022 A1* | 12/2010 | Shinozaki et al. | ........... | 365/194 |
| 2011/0234281 A1* | 9/2011 | Kim | ............................ | 327/158 |
| 2013/0176787 A1* | 7/2013 | Ross et al. | .............. | 365/185.18 |
| 2013/0214833 A1* | 8/2013 | Kim | ............................ | 327/156 |

FOREIGN PATENT DOCUMENTS

| | | |
|---|---|---|
| KR | 1020050059557 | 6/2005 |
| KR | 1020060059299 | 6/2006 |
| KR | 1020090074969 | 7/2009 |
| KR | 1020090109254 | 10/2009 |
| KR | 1020110060740 | 6/2011 |

* cited by examiner

*Primary Examiner* — Adam Houston
(74) *Attorney, Agent, or Firm* — IP & T Group LLP

(57) ABSTRACT

A synchronous semiconductor device includes an internal command generation unit configured to generate an internal command corresponding to a source command, a delay locked loop configured to delay a source clock by a first delay time required for delay-locking to generate a delay locked clock, a delay time determination unit configured to determine a second delay time for delay-locking the internal command using the source clock, the second delay time being determined by reflecting a third delay time generated on a command path, and a latency control unit configured to shift the internal command by a shifting period, in which the second delay time is reflected, in response to the delay locked clock.

19 Claims, 7 Drawing Sheets

SYNCHRONOUS SEMICONDUCTOR DEVICE HAVING DELAY LOCKED LOOP FOR LATENCY CONTROL

CROSS-REFERENCE TO RELATED APPLICATION

The present application claims priority of Korean Patent Application No. 10-2012-0077187, filed on Jul. 16, 2012, which is incorporated herein by reference in its entirety.

BACKGROUND

1. Field

Exemplary embodiments of the present invention relate to a semiconductor design technology, and more particularly, to a synchronous semiconductor device having a delay locked loop (DLL) for latency control.

2. Description of the Related Art

In general, a synchronous semiconductor device, such as a double data rate synchronous dynamic random access memory DDR SDRAM), outputs data according to a delay locked loop (DLL) and column address strobe (CAS) latency in a read operation. The CAS latency indicates the number of clock cycles until first data is output through a data pad from a read command synchronized with an external clock.

FIG. 1 is a block diagram illustrating a conventional synchronous semiconductor device.

Referring to FIG. 1, a synchronous semiconductor device 100 includes a clock buffer unit 110 for buffering an external clock CLK, a delay locked loop (DLL) 120 for determining a first delay time tD1 for delay-locking a source clock ICLK buffered by the clock buffer unit 110 and generating a delay locked clock DLLCLK by delaying the source clock ICLK by the first delay time tD1, a latency shifting control unit 130 for generating a shifting control signal CLSHIFT based on CAS latency CL, a command buffer unit 140 for buffering an external command CMD, an internal command generation unit 150 for generating an internal command ICMD2 in response to a source command ICMD buffered by the command buffer unit 140, a first variable delay unit 160 for delaying the internal command ICMD2 by the first delay time tD1 in response to a delay adjustment signal DLY_CTRL output from the delay locked loop 120, a latency shifting unit 170 for shifting an internal command CMDD delayed by the first variable delay unit 160 in response to the shifting control signal CLSHIFT and the delay locked clock DLLCLK, and an output unit 180 for outputting read data RD_DATA to an exterior in response to a read command RD_CMD shifted by the latency shifting unit 170.

The delay locked loop 120 includes a second variable delay section 121 for outputting the delay locked clock DLLCLK by delaying the source clock ICLK by the first delay time tD1 in response to the delay adjustment signal DLY_CTRL, a first replica delay section 123 for outputting a feedback clock FBCLK by delaying the delay locked clock DLLCLK by a second delay time tD2, a phase comparison section 125 for comparing the phase of the feedback clock FBCLK with the phase of the source clock ICLK, and a delay adjustment section 127 for generating the delay adjustment signal DLY_CTRL in response to an output signal PD of the phase comparison section 125. The second delay time tD2 is obtained by modeling a delay time generated on an internal input/output path, and includes a third delay time tD3 generated in the clock buffer unit 110 and a fourth delay time tD4 generated in the output unit 180.

The latency shifting control unit 130 includes a third variable delay section 131 for delaying a counting source signal CNT by the first delay time tD1 in response to the delay adjustment signal DLY_CTRL, a second replica delay section 133 for delaying a delayed signal DLYCNT1 output from the third variable delay section 131 by the second delay time tD2, a counting section 135 for counting a delay time tD1+tD2 of a delayed signal DLYCNT2 feeding back from the second replica delay section 133 with respect to the counting source signal CNT, and a shifting control section 137 for outputting the shifting control signal CLSHIFT corresponding to a result obtained by subtracting a counting signal NTCK1 output from the counting section 135 from the CAS latency CL.

Hereinafter, the operation of the synchronous semiconductor device 100 configured as above will be described with reference to FIGS. 2A and 2B.

FIG. 2A is a timing chart for explaining the operation of the synchronous semiconductor device 100 in a low frequency environment, and FIG. 2B is a timing chart for explaining the operation of the synchronous semiconductor device 100 in a high frequency environment.

Referring to FIG. 2A, the clock buffer unit 110 buffers the external clock CLK to output the source clock ICLK. At this time, the third delay time tD3 is generated by the clock buffer unit 110. The delay locked loop 120 delays the source clock ICLK by the first delay time till required for delay-locking and generates the delay locked clock DLLCLK.

Meanwhile, the counting section 135 counts the delay time tD1+tD2 of the delayed signal DLYCNT2 feeding back from the second replica delay section 133 with respect to the counting source signal CNT, and outputs a counting signal NTCK1 corresponding to a result of the counting, and the shifting control section 137 provides the latency shifting unit 170 with the shifting control signal CLSHIFT corresponding to the result obtained by subtracting the counting signal NTCK1 output from the counting section 135 from the CAS latency CL.

In such a state, when the external command CMD is applied from an exterior, the command buffer unit 140 buffers the external command CMD to output the source command ICMD. At this time, the third delay time tD3 is generated by the command buffer unit 140. Then, the internal command generation unit 150 generates the internal command ICMD2 corresponding to the source command ICMD. At this time, a fifth delay time tD5 is generated by the internal command generation unit 150. Subsequently, the first variable delay unit 160 delays the internal command ICMD2 by the first delay time tD1 based on a delay amount adjusted based on the delay adjustment signal DLY_CTRL, and outputs a delayed internal command CMDD. The latency shifting unit 170 shifts the internal command CMDD delayed by the first variable delay unit 160 in response to the shifting control signal CLSHIFT, wherein the latency shifting unit 170 shifts the internal command CMDD in synchronization with the delay locked clock DLLCLK.

Accordingly, the output unit 180 outputs the read data RD_DATA externally in response to the read command RD_CMD output from the latency shifting unit 170.

However, the synchronous semiconductor device 100 configured as above has the following concerns.

The latency shifting unit 170 shifts the delayed internal command CMDD in synchronization with the delay locked clock DLLCLK. However, the delayed internal command CMDD causes delay corresponding to the fifth delay time tD5 as compared with the delay locked clock DLLCLK. This is because the internal command generation unit 150 is further provided on an internal command path as compared with an internal clock path. Therefore a margin of the delayed internal command CMDD for being aligned in the delay locked clock DLLCLK is reduced, and is further reduced in the high frequency environment as illustrated in FIG. 2B.

SUMMARY

Exemplary embodiments of the present invention are directed to a synchronous semiconductor device having considered delay occurring in an internal command path.

In accordance with an embodiment of the present invention, a synchronous semiconductor device includes an internal command generation unit configured to generate an internal command corresponding to a source command, a delay locked loop configured to delay a source clock by a first delay time required for delay-locking to generate a delay locked clock, a delay time determination unit configured to determine a second delay time for delay-locking the internal command using the source clock, the second delay time being determined by reflecting a third delay time generated on a command path, and a latency control unit configured to shift the internal command by a shifting period, in which the second delay time is reflected, in response to the delay locked clock.

In accordance with another embodiment of the present invention, a synchronous semiconductor device includes an internal command generation unit configured to generate an internal command corresponding to a source command, a first delay locked loop configured to determine a first delay time for delay-locking a source dock, delay the source clock by the first delay time, and generate a delay locked clock, a second delay locked loop configured to determine a second delay time for delay-locking the internal command using the source clock, the second delay time being determined by reflecting a third delay time generated on a command path, a latency shifting control unit configured to generate a shifting control signal based on the third delay time and predetermined first latency, and a latency control unit configured to shift the internal command by reflecting the second delay time, the internal command being shifted in response to the shifting control signal and the delay locked clock.

In accordance with yet another embodiment of the present invention, a synchronous semiconductor device includes a command buffer unit configured to buffer an external command, an internal command generation unit configured to generate an internal command in response to a source command buffered by the command buffer unit, a clock buffer unit configured to buffer an external clock, a first delay locked loop configured to determine a first delay time for delay-locking a source clock buffered by the clock buffer unit, delay the source clock by the first delay time, and generate a delay locked clock, a second delay locked loop configured to determine a second delay time for delay-locking the internal command using the source dock, the second delay time being determined by reflecting a third delay time generated on a command path, a latency control unit configured to shift the internal command by reflecting the second delay time, the internal command being shifted in response to a shifting control signal and the delay locked clock, an output unit configured to output column data externally in response to a column command shifted by the latency control unit, a delay time counting unit configured to count a total delay time of the second delay time, the third delay time, and a fourth delay time generated on an internal in input/output path, and a shifting control unit configured to generate the shifting control signal in response to CAS latency and an output signal of the delay time counting unit.

A delay time additionally generated on an internal command path with respect to a clock path is compensated, so that a margin between a delay locked clock and an internal command may be secured, especially in a high frequency environment, where this effect may be significant.

BRIEF DESCRIPTION OF THE DRAWINGS

FIGS. 2A and 28 are timing diagrams for explaining the operation of a synchronous semiconductor device shown in FIG. 1.

DETAILED DESCRIPTION

Figure 1:
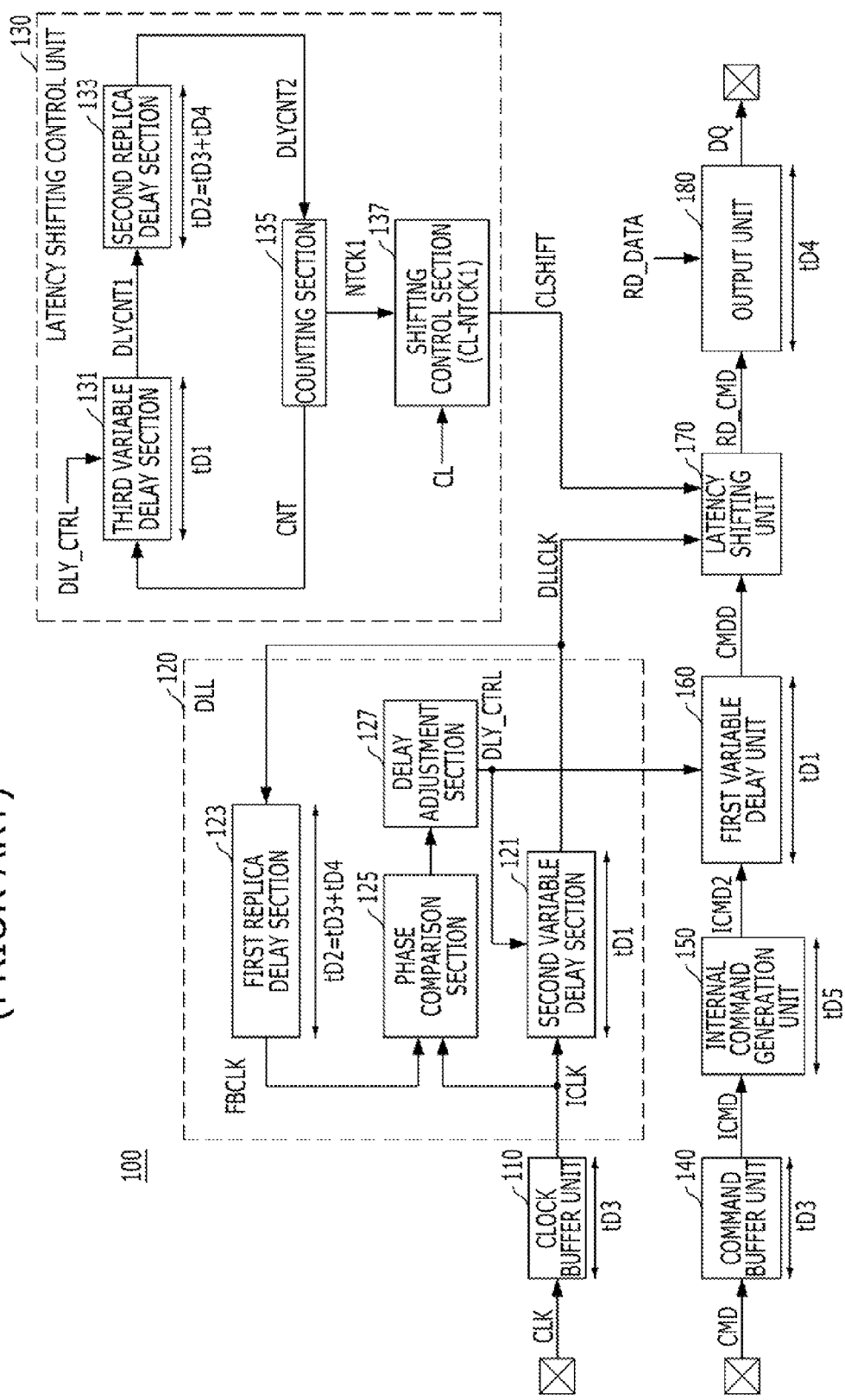
FIG. 1 is a block diagram illustrating a conventional synchronous semiconductor device.
Figure 2A:
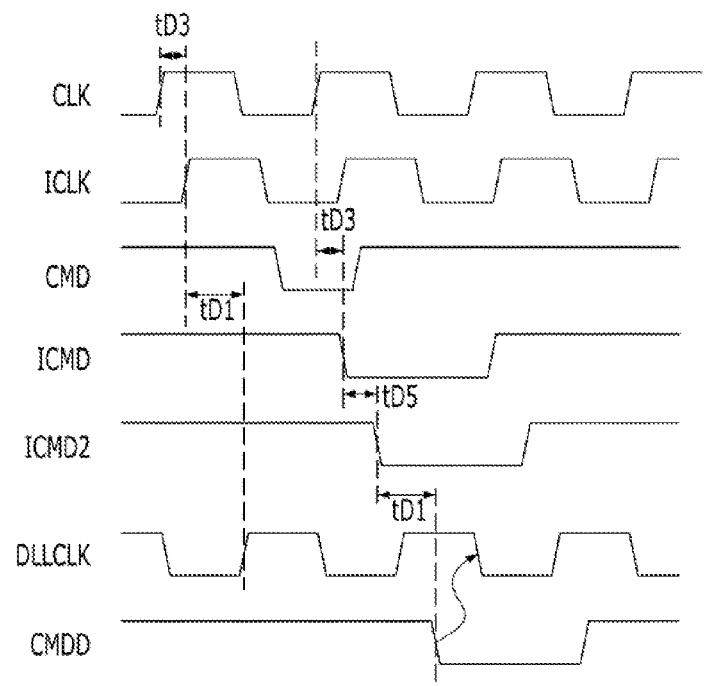
Figure 2B:
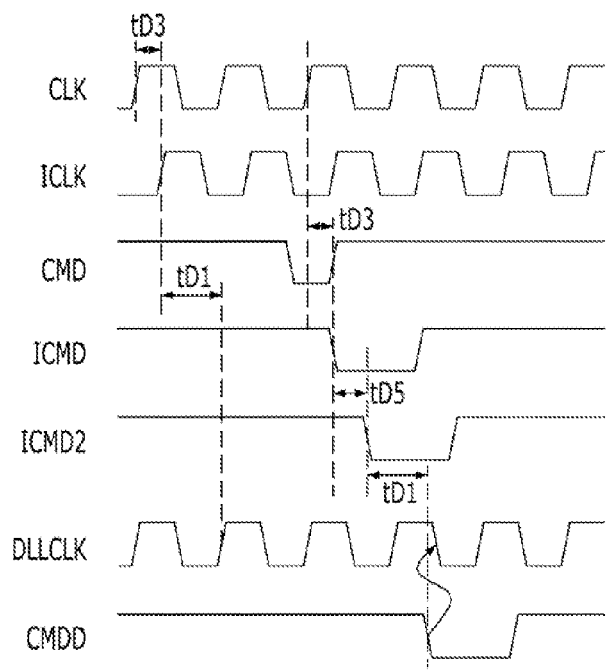

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. In this specification a singular form may include a plural form as long as it is not specifically mentioned in a sentence.

Figure 3:
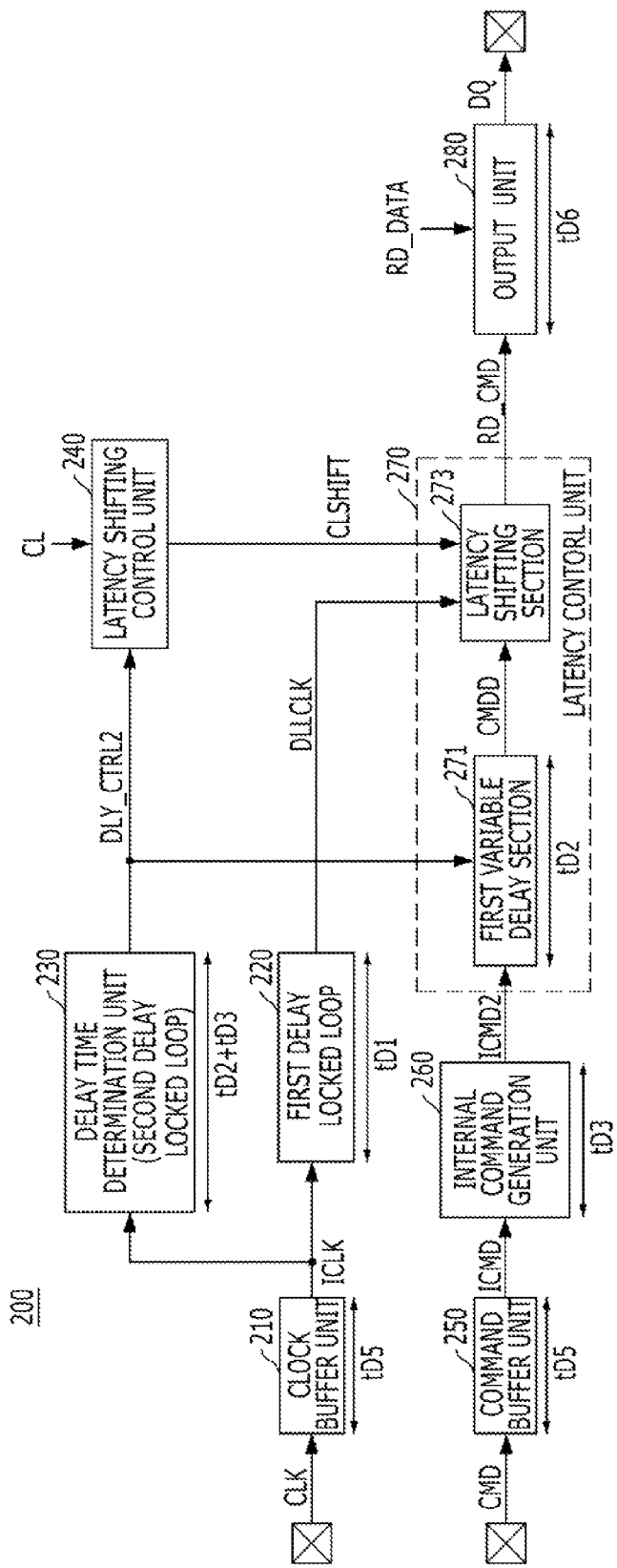
FIG. 3 is a block diagram illustrating a synchronous semiconductor device in accordance with an embodiment of the present invention.
Figure 4:
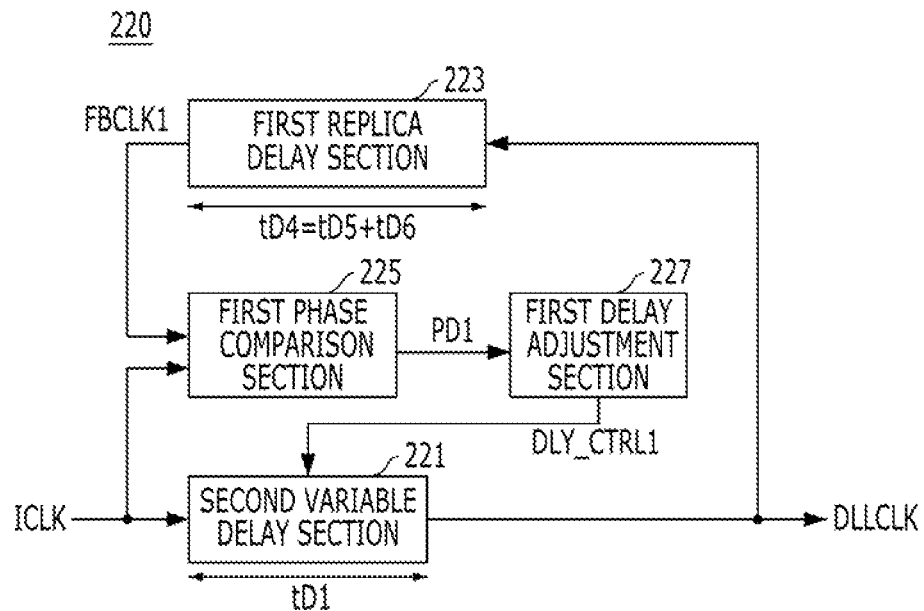
FIG. 4 is a detailed diagram illustrating a first delay locked loop shown in FIG. 3.
Figure 5:
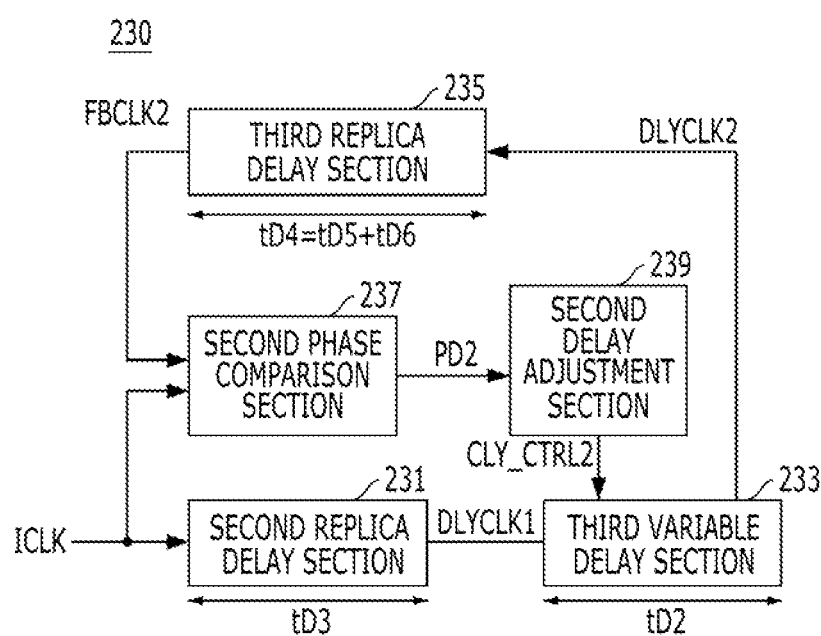
FIG. 5 is a detailed diagram illustrating a delay time determination unit shown in FIG. 3.
Figure 6:
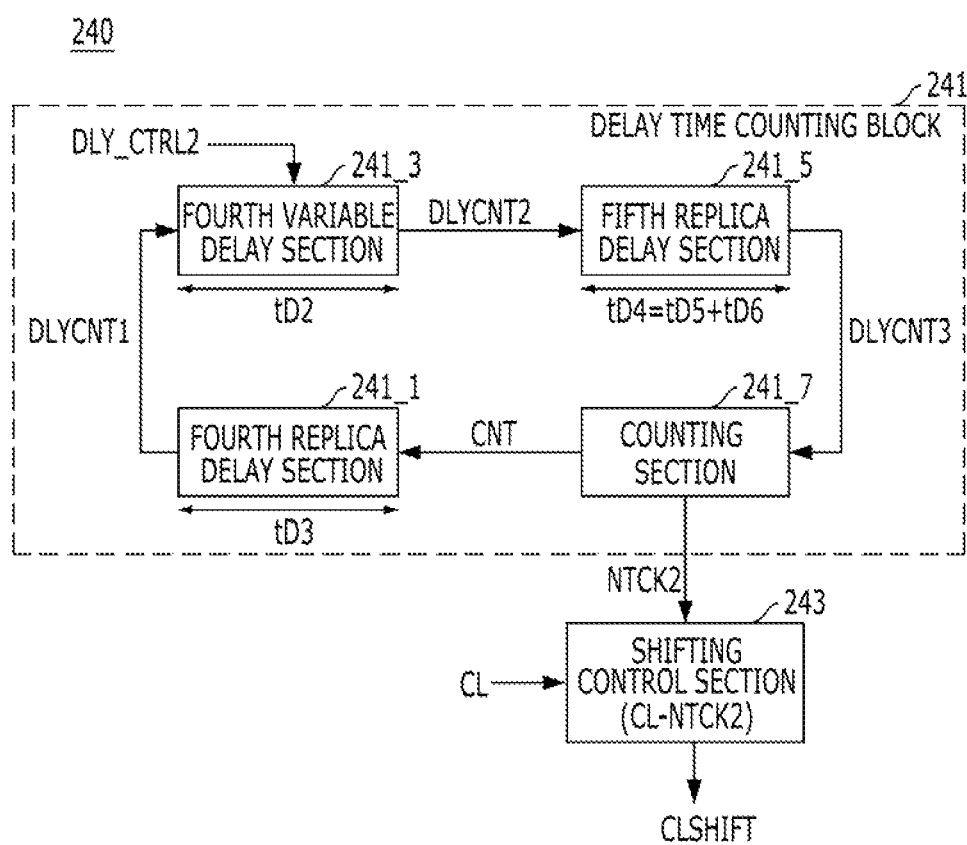
FIG. 6 is a detailed diagram illustrating a latency shifting control unit shown in FIG. 3.

FIG. 3 is a block diagram illustrating a synchronous semiconductor device in accordance with an embodiment of the present invention, FIG. 4 is a detailed diagram of a first delay locked loop shown in FIG. 3, FIG. 5 is a detailed diagram of a delay time determination unit shown in FIG. 3, and FIG. 6 is a detailed diagram of a latency shifting control unit shown in FIG. 3.

Referring to FIG. 3, a synchronous semiconductor device 200 includes a clock buffer unit 210, a first delay locked loop 220, a delay time determination unit 230, a latency shifting control unit 240, a command buffer unit 250, an internal command generation unit 260, a latency control unit 270, and an output unit 280. The clock buffer unit 210 is configured to buffer an external clock CLK. The first delay locked loop 220 is configured to determine a first delay time tD1 for delay-locking a source clock ICLK buffered by the clock buffer unit 210 and to generate a delay locked clock. DLLCLK by delaying the source clock ICLK by the first delay time tD1. The delay time determination unit 230 is configured to determine a second delay time tD2 for delay-locking an internal command ICMD2 using the source clock ICLK, wherein the delay time determination unit 230 determines the second delay time tD2 by reflecting a third delay time tD3 that is generated in the internal command generation unit 260. The latency shifting control unit 240 is configured to generate a shifting control signal CLSHIFT based on the third delay time tD3 and CAS latency CL. The command buffer unit 250 is configured to buffer an external command CMD. The internal command generation unit 260 is configured to generate an internal command ICMD2 in response to a source command ICMD buffered by the command buffer unit 250. The latency control unit 270 is configured to shift the internal command ICMD2 by reflecting the second delay time tD2, wherein the latency control unit 270 shifts the internal command ICMD2 in response to the shifting control signal CLSHIFT and a delay locked clock DLLCLK. The output unit 280 is configured to output read data RD_DATA externally in response to a read command RD_CMD shifted by the latency control unit 270.

The first delay locked loop 220, as illustrated in FIG. 4, includes a second variable delay section 221, a first replica delay section 223, a first phase comparison section 225 and a first delay adjustment section 227. The second variable delay section 221 is configured to delay the source clock ICLK by the first delay time tD1 in response to a first delay adjustment signal DLY_CTRL1 and output the delay locked clock DLLCLK. The first replica delay section 223 is configured to delay the delay locked clock DLLCLK by a fourth delay time tD4, which is equivalent to tD5+tD6, generated on an internal input/output path (including the clock buffer unit 210 and the output unit 280), and to output a first feedback clock FBCLK1. The first phase comparison section 225 is configured to compare the phase of the first feedback dock FBCLK1 with the phase of the source dock ICLK. The first delay adjustment section 227 is configured to generate the first delay adjustment signal DLY_CTRL1 in response to an output signal PD1 of the first phase comparison section 225.

The delay time determination unit 230, as illustrated in FIG. 5, may be prepared in the form of a closed loop-type delay locked loop similarly to the first delay locked loop 220. Hereinafter, the delay time determination unit 230 will be referred to as a second delay locked loop 230. The second delay locked loop 230 includes a second replica delay section 231, a third variable delay section 233, a third replica delay section 235, a second phase comparison section 237, and a second delay adjustment section 239. The second replica delay section 231 is configured to delay the source clock ICLK by a third delay time tD3. The third variable delay section 233 is configured to delay a clock DLYCLK1 delayed by the second replica delay section 231 by the second delay time tD2 in response to a second delay adjustment signal DLY_CTRL2. The third replica delay section 235 is configured to delay a clock DLYCLK2 delayed by the third variable delay section 233 by the fourth delay time tD4, which is generated on the internal input/output path (including the clock buffer unit 210 and the output unit 280), and to output a second feedback clock FBCLK2. The second phase comparison section 237 is configured to compare the phase of the second feedback clock FBCLK2 with the phase of the source clock ICLK. The second delay adjustment section 239 is configured to generate the second delay adjustment signal DLY_CTRL2 in response to an output signal PD2 of the second phase comparison section 237.

The latency shifting control unit 240, as illustrated in FIG. 6, includes a delay time counting block 241, and a shifting control section 243. The delay time counting block 241 is configured to count the total delay time tD2+tD3+tD5+tD6 of the second delay time tD2, the third delay time tD3, and the fourth delay time tD4. The shifting control section 243 is configured to generate the shifting control signal CLSHIFT in response to the CAS latency CL and a counting signal NTCK2 output from the delay time counting block 241.

The delay time counting block 241 includes a fourth replica delay section 241_1, a fourth variable delay section 241_3, a fifth replica delay section 241_5, and a counting section 241_7. The fourth replica delay section 241_1 is configured to delay a counting source signal DLY_CTRL1 by the third delay time tD3. The fourth variable delay section 241_3 is configured to delay a delayed signal DLYCNT1 output from the fourth replica delay section 241_1 by the second delay time tD2 in response to the second delay adjustment signal DLY_CTRL2. The fifth replica delay section 241_5 is configured to delay a delayed signal DLYCNT2 output from the fourth variable delay section 241_3 by the fourth delay time tD4. The counting section 241_7 is configured to count the delay time tD2+tD+tD5+tD6 of a delayed signal DLYCNT3 feeding back from the fifth replica delay section 241_5 with respect to a counting source signal CNT.

The shifting control section 243 is configured to subtract the counting signal NTCK2 output from the counting section 241_7 from the CAS latency CL, and to provide the latency control unit 270 (shown in FIG. 3) with the shifting control signal CLSHIFT corresponding to a result of the subtraction operation.

Referring again to FIG. 3, the internal command generation unit 260 may include a command decoder and an internal command output section (not illustrated). The command decoder is configured to decode the source command, and the internal command output section is configured to shift a command decoded by the command decoder by additive latency (AL), and to output the internal command ICMD2.

The latency control unit 270 includes a first variable delay section 271 and a latency shifting section 273. The first variable delay section 271 is configured to delay the internal command ICMD2 by the second delay time tD2 in response to the second delay adjustment signal DLY_CTRL2. The latency shifting section 273 is configured to shift an internal command CMDD delayed by the first variable delay section 271 in response to the shifting control signal CLSHIFT and the delay locked clock DLLCLK.

Hereinafter, the operation of the synchronous semiconductor device 200 configured as above in accordance with the embodiment of the present invention will be described with reference to FIGS. 7 and 8.

Figure 7:
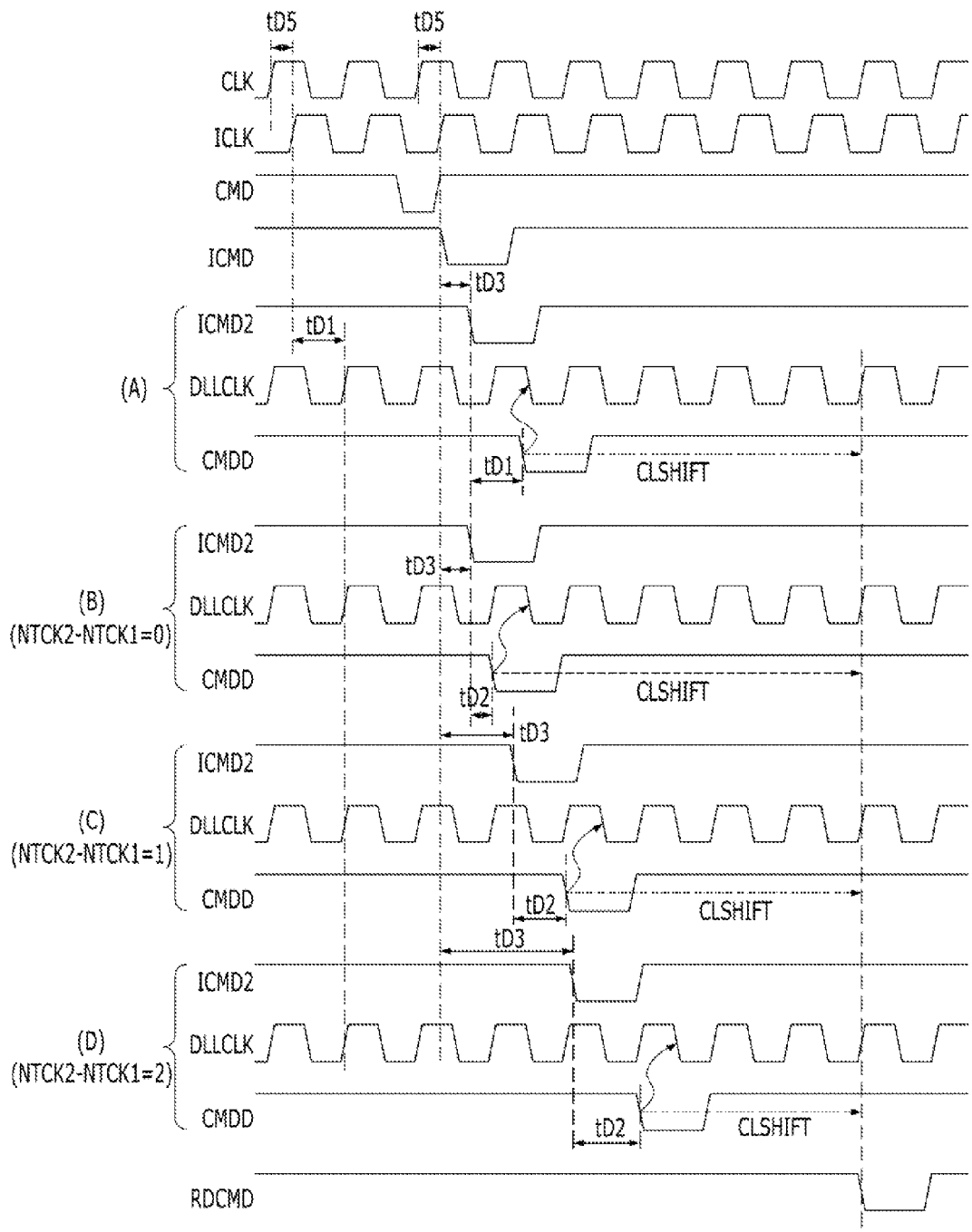
FIG. 7 is a timing diagram for explaining the operation of a synchronous semiconductor device in accordance with an embodiment of the present invention.
Figure 8:
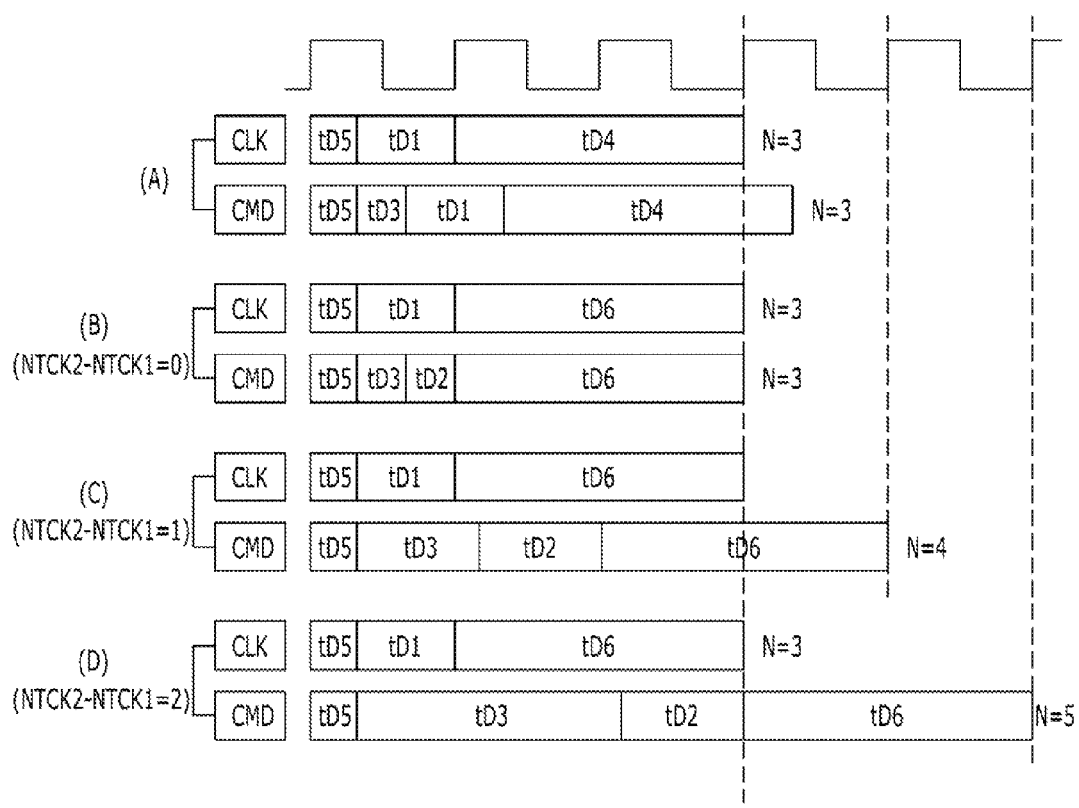
FIG. 8 is a diagram for additionally explaining an operation shown in FIG. 7.

FIG. 7 is a timing diagram for explaining the operation of the synchronous semiconductor device 200 in accordance with the embodiment of the present invention together with the timing diagram in accordance with the conventional art, and FIG. 8 is a diagram for additionally explaining the operation shown in FIG. 7. Referring to FIGS. 7 and 8, (A) represents the conventional art shown in FIG. 1, and other (B), (C), and (D) represent the embodiment of the present invention shown in FIG. 3.

Referring to FIG. 7, the clock buffer unit 210 buffers the external clock CLK to output the source clock ICLK. The first delay locked loop 220 determines the first delay time tD1 for delay-locking the source clock ICLK and generates the delay locked clock DLLCLK by delaying the source clock ICLK by the first delay time tD1. Simultaneously, the delay time determination unit 230 determines the second delay time tD2 for delay-locking the internal command ICMD2 using the source clock ICLK, wherein the delay time determination unit 230 determines the second delay time tD2 by reflecting the third delay time tD3 that is generated in the internal command generation unit 260. At this time, the fourth variable delay section 241_3 of the delay time counting block 241 and the first variable delay section 271 of the latency control unit 270 are adjusted to a delay amount corresponding to the second delay time tD2 based on the second delay adjustment signal DLY_CTRL2 output from the second delay locked loop 230.

The delay time counting block 241 counts the total delay time tD2+tD3+tD5+tD6 of the second delay time tD2, the third delay time tD3, and the fourth delay time tD4, and the shifting control section 243 subtracts the counting signal NTCK2 output from the delay time counting block 241 from the CAS latency CL, and provides the latency shifting section 273 with the shifting control signal CLSHIFT corresponding to a result of the subtraction.

In such a state, when the external command CMD is applied, the command buffer unit 250 buffers the external command CMD to generate the source command ICMD, and the internal command generation unit 260 generates the internal command ICMD2 corresponding to the source command ICMD. At this time, a predetermined delay time tD5+tD3 is generated until the internal command ICMD2 is generated from the time point at which the external command CMD is applied.

The first variable delay section 271 of the latency control unit 270 delays the internal command ICMD2 by the second delay time tD2 to output the delayed internal command CMDD. As described above, the second delay time tD2 has a value smaller than that of the first delay time tD1, which is determined by the delay locked loop 120 in the conventional art, as the second delay locked loop 230 determines the second delay time tD2 by reflecting the third delay time tD3. When the counting signal NTCK2 output from the counting block 241 and the counting signal NTCK1 output from the counting section 135 have the same value (NTCK2−NTCK1=0), since the first delay time tD1 determined by the delay locked loop 120 in the conventional art is substantially equal to the sum tD2+tD3 of the second delay time tD2 and the third delay time tD3 in the embodiment of the present invention, the second delay time tD2 has a value smaller than that of the first delay time tD1 in the conventional art.

Then, the latency shifting section 273 of the latency control unit 270 shifts the delayed internal command CMDD in response to the shifting control signal CLSHIFT and the delay locked clock DLLCLK. Here, in relation to the delayed internal command CMDD, it can be understood that a margin for being aligned in the delay locked clock DLLCLK is sufficiently secured as compared with the conventional art. Consequently, the latency control margin is ensured, so that the latency shifting section 273 may accurately output the read command RD_CMD at a predetermined timing.

Meanwhile, regardless of the value of the third delay time tD3, since the shifting control signal CLSHIFT is generated by reflecting the third delay time tD3 (NTCK2−NTCK1=1, NTCK2−NTCK1=2), the read command RD_CMD is output at the same timing. In other words, as the third delay time tD3 is increased, the delayed internal command CMDD is aligned in the delay locked clock DLLCLK delayed by the third delay time tD3. However, since this is compensated in a shifting period, the read command RDCMD is output at the same timing.

Furthermore, regardless of the value of the third delay time tD3, since the second delay time tD2 compensates for this, the latency control margin for being aligned in the delay locked clock DLLCLK is sufficiently ensured in relation to the delayed internal command CMDD. The reason for this is as follows. As illustrated in FIG. 8, according to the conventional art, the delay time tD5+tD3+tD1+tD4 generated on a command path is not an integer time of a clock cycle tCK due to the third delay time tD3. However, according to the embodiment of the present invention, regardless of the value of the third delay time tD3, since the second delay time tD2 compensates for this, the delay time tD5+tD3+tD2+tD6 generated on the command path is an integer time of the clock cycle tCK. Consequently, according to the embodiment of the present invention, it may be possible to sufficiently ensure the latency control margin, as compared with the conventional art.

In accordance with the embodiment of the present invention as described above, the latency control margin for shifting a predetermined command may be sufficiently secured, so that the reliability of a shifting operation may be improved.

While the present invention has been described with respect to the specific embodiments, it will be apparent to those skilled in the art that various changes and modifications may be made without departing from the spirit and scope of the invention as defined in the following claims.

For example, in the embodiment of the present invention, a latency control process according to a read operation is described as an example. However, the present invention is not limited thereto. For example, the present invention may be applied to a technology requiring latency control such as a write operation, an on-die termination (ODT) operation, or a dynamic ODT operation.

What is claimed is:

1. A synchronous semiconductor device comprising
   an internal command generation unit configured to generate an internal command corresponding to a source command;
   a delay locked loop configured to delay a source clock by a first delay time required for delay-locking to generate a delay locked clock;
   a delay time determination unit configured to determine a second delay time for delay-locking the internal command using the source clock, the second delay time being determined by reflecting a third delay time generated on a command path; and
   a latency control unit configured to shift the internal command by a shifting period, in which the second delay time is reflected, in response to the delay locked clock.

2. The synchronous semiconductor device of claim 1, wherein the command path includes the internal command generation unit.

3. The synchronous semiconductor device of claim wherein the internal command generation unit comprises:
   a command decoder configured to decode the source command; and
   a command output section configured to shift a command decoded by the command decoder by predetermined latency, and to output the internal command.

4. The synchronous semiconductor device of claim 3, wherein the predetermined latency includes additive latency.

5. A synchronous semiconductor device comprising:
   an internal command generation unit configured to generate an internal command corresponding to a source command;
   a first delay locked loop configured to determine a first delay time for delay-locking a source clock, delay the source clock by the first delay time, and generate a delay locked clock;
   a second delay locked loop configured to determine a second delay time for delay-locking the internal command using the source clock, the second delay time being determined by reflecting a third delay time generated on a command path;

a latency shifting control unit configured to generate a shifting control signal based on the third delay time and predetermined first latency; and a latency control unit configured to shift the internal command by reflecting the second delay time, the internal command being shifted in response to the shifting control signal and the delay locked clock.

6. The synchronous semiconductor device of claim 5, wherein the command path includes the internal command generation unit.

7. The synchronous semiconductor device of claim wherein the internal command generation unit comprises:

a command decoder configured to decode the source command; and a command output section configured to shift a command decoded by the command decoder by predetermined second latency, and to output the internal command.

8. The synchronous semiconductor device of claim wherein the predetermined second latency includes additive latency.

9. The synchronous semiconductor device of claim wherein the latency control unit comprises:

a variable delay section configured to delay the internal command by the second delay time; and a latency shifting section configured to shift an internal command delayed by the variable delay section in response to the shifting control signal and the delay locked clock.

10. The synchronous semiconductor device of claim 5, wherein the predetermined first latency includes column address strobe (CAS) latency.

11. A synchronous semiconductor device comprising:

a command buffer unit configured to buffer an external command;

an internal command generation unit configured to generate an internal command in response to a source command buffered by the command buffer unit;

a clock buffer unit configured to buffer an external clock;

a first delay locked loop configured to determine a first delay time for delay-locking a source clock buffered by the clock buffer unit, delay the source clock by the first delay time, and generate a delay locked clock;

a second delay locked loop configured to determine a second delay time for delay-locking the internal command using the source clock, the second delay time being determined by reflecting a third delay time generated on a command path;

a latency control unit configured to shift the internal command by reflecting the second delay time, the internal command being shifted in response to a shifting control signal and the delay locked clock;

an output unit configured to output column data externally in response to a column command shifted by the latency control unit;

a delay time counting unit configured to count a total delay time of the second delay time, the third delay time, and a fourth delay time generated on an internal input/output path; and a shifting control unit configured to generate the shifting control signal in response to column address strobe (CAS) latency and an output signal of the delay time counting unit.

12. The synchronous semiconductor device of claim 11, wherein the command path includes the internal command generation unit.

13. The synchronous semiconductor device of claim 11, wherein the internal command generation unit comprises:

a command decoder configured to decode the source command; and a command output section configured to shift a command decoded by the command decoder by additive latency, and to output the internal command.

14. The synchronous semiconductor device of claim 11, wherein the first delay locked loop comprises:

a first variable delay section configured to delay the source clock by the first delay time in response to a first delay adjustment signal and to output the delay locked clock;

a first replica delay section configured to delay the delay locked dock by the fourth delay time, and to output a feedback dock;

a first phase comparison section configured to compare a phase of the feedback clock with a phase of the source clock; and a first delay adjustment section configured to generate the first delay adjustment signal in response to an output signal of the first phase comparison section.

15. The synchronous semiconductor device of claim 11, wherein the second delay locked loop comprises:

a second replica delay section configured to delay the source clock by the third delay time;

a second variable delay section configured to delay a clock delayed by the second replica delay section by the second delay time in response to a second delay adjustment signal;

a third replica delay section configured to delay a clock delayed by the second variable delay section by the fourth delay time, and to output a feedback clock;

a second phase comparison section configured to compare a phase of the feedback clock with a phase of the source clock; and a second delay adjustment section configured to generate the second delay adjustment signal in response to an output signal of the second phase comparison section.

16. The synchronous semiconductor device of claim 14, wherein the fourth delay time includes a fifth delay time generated in the clock buffer unit or the command buffer unit, and a sixth delay time generated in the output unit.

17. The synchronous semiconductor device of claim 15, wherein the latency control unit comprises:

a third variable delay section configured to delay the internal command by the second delay time in response to the second delay adjustment signal; and a latency shifting section configured to shift an internal command delayed by the fourth variable delay section in response to the shifting control signal and the delay locked clock.

18. The synchronous semiconductor device of claim 15, wherein the delay time counting unit comprises:

a fourth replica delay section configured to delay a counting source signal by the third delay time;

a fourth variable delay section configured to delay a delayed signal output from the fourth replica delay section by the second delay time in response to the second delay adjustment signal;

a fifth replica delay section configured to delay a delayed signal output from the fourth variable delay section by the fourth delay time; and a counting section configured to count a delay time of a delayed signal feedback from the fifth replica delay section with respect to a counting source signal.

19. The synchronous semiconductor device of claim 18, wherein the shifting control section is configured to subtract an output signal of the counting section from the column address strobe (CAS) latency, and to provide the shifting control signal corresponding to a result of a subtraction operation.

* * * * *